(12) United States Patent
Lilja et al.

(10) Patent No.: US 12,316,323 B2
(45) Date of Patent: May 27, 2025

(54) HIGH VOLTAGE PULSE GENERATOR UNIT

(71) Applicant: OPTICEPT TECHNOLOGIES AB, Lund (SE)

(72) Inventors: Per Lilja, Limhamn (SE); Hanshenric Carenborn, Klägerup (SE)

(73) Assignee: OPTICEPT TECHNOLOGIES AB, Lund (SE)

( * ) Notice: Subject to any disclaimer, the term of this patent is extended or adjusted under 35 U.S.C. 154(b) by 36 days.

(21) Appl. No.: 18/266,755

(22) PCT Filed: Dec. 14, 2021

(86) PCT No.: PCT/SE2021/051257
§ 371 (c)(1),
(2) Date: Jun. 12, 2023

(87) PCT Pub. No.: WO2022/139659
PCT Pub. Date: Jun. 30, 2022

(65) Prior Publication Data
US 2024/0063780 A1   Feb. 22, 2024

(30) Foreign Application Priority Data

Dec. 22, 2020 (SE) ................. SE2051549-0

(51) Int. Cl.
*H03K 3/57* (2006.01)
*H03K 3/281* (2006.01)
*H03K 17/693* (2006.01)

(52) U.S. Cl.
CPC .............. *H03K 3/57* (2013.01); *H03K 3/281* (2013.01); *H03K 17/693* (2013.01)

(58) Field of Classification Search
CPC ....................................................... H03K 3/57
USPC ....................................................... 327/365
See application file for complete search history.

(56) References Cited

FOREIGN PATENT DOCUMENTS

CN   109510611        3/2019
CN   109510611 A  *   3/2019  ............. H03K 3/57

OTHER PUBLICATIONS

XP 11357896A, Jun. 2011, IEEE Transactions on Diel.
XP 11748830A, Oct. 2019, IEEE Transactions on Diel.

* cited by examiner

*Primary Examiner* — Tomi Skibinski
(74) *Attorney, Agent, or Firm* — Stanzione & Associates, PLLC; Patrick Stanzione

(57) ABSTRACT

The present invention describes a high voltage pulse generator unit comprising a primary side, a transformer and a secondary side, wherein the primary side comprises a winding and wherein the secondary side comprises multiple windings and multiple pulse module units (PMUs), and wherein each PMU comprises the winding and a switching element.

14 Claims, 1 Drawing Sheet

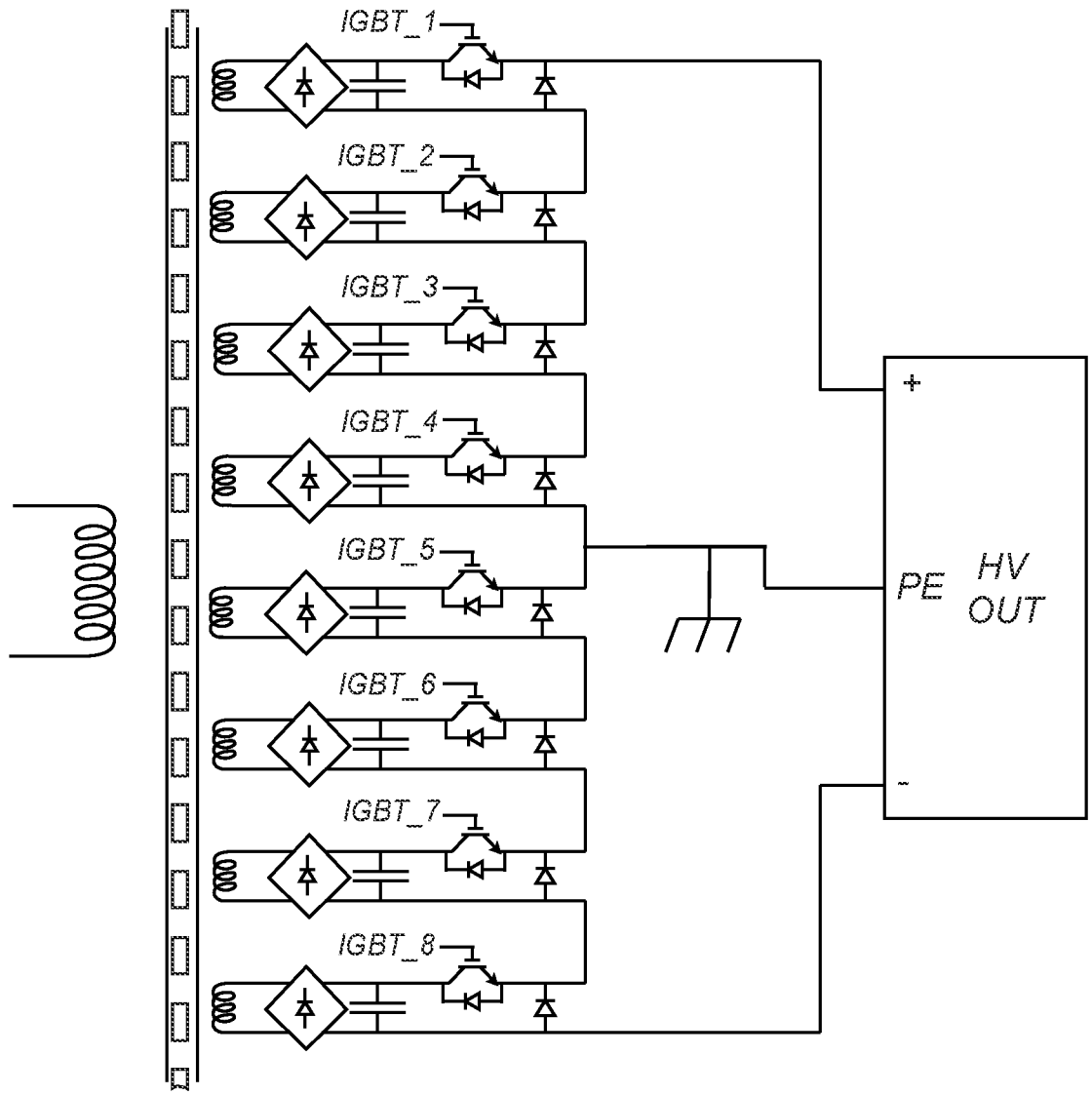

HIGH VOLTAGE PULSE GENERATOR UNIT

FIELD OF THE INVENTION

The present invention relates to a high voltage pulse generator unit.

TECHNICAL BACKGROUND

Different type of high voltage pulse generators have been described in the past, also in and for the field of PEF (pulsed electric field). For instance, in WO2009/126084 there is disclosed an arrangement for the exposure of a pumpable medium to an electric field, wherein the arrangement comprises at least two power supplies for the generation of an electrical voltage, wherein the respective power supply is arranged for synchronous control to establish a series connection between at least two of said at least two power supplies, and wherein a resulting composite voltage arises between a first and a second electrode plate, which resulting composite voltage creates the electric field between the first and the second electrode plate.

The present invention is directed to providing an improved high voltage pulse generator unit, particularly efficient in the field of PEF generation.

SUMMARY OF THE INVENTION

The latter stated purpose above is achieved by a high voltage pulse generator unit comprising a primary side, a transformer and a secondary side, wherein the primary side comprises a winding and wherein the secondary side comprises multiple windings and multiple pulse module units (PMUs), and wherein each PMU comprises the winding and a switching element. The high voltage pulse generator unit with its transformer has one or several primary windings and multiple secondary windings. The advantage with one primary winding is that all the power is channeled through this. This means that the components before the transformer can be dimensioned to handle all the power, which results in a smaller number of components on the primary side, which reduces both cost and size. It also simplifies production and testing. The advantage with two or several primary windings is to be able to build the primary side up to a power level where it's possible to find standard components. It is then possible achieve a higher total power output, but still use standard components on the primary side.

A high voltage pulse generator unit according to the present invention, and such as described above, provides several advantages. Firstly, the voltage is divided over several circuits independently, such as over multiple IGBTs, as further discussed below. Secondly, each such IGBT is only responsible for its own voltage. Furthermore, the build up of the pulse height is simple via division. Moreover, the voltage on the high voltage side is divided in a simple way without the need of extra components.

Furthermore, other possible advantages according to the present invention are the possibility to only use voltage needed and only switch in the voltage from the desired PMUs. Moreover, by use of the present invention, current interference between different parts may be minimized. Furthermore, the present invention also supports the use of standard components and provides a flexible system where modules may be used and combined. Other advantages according to the present invention provide for high safety and isolation, faster edges, a compact energy transfer, a compact arrangement with only a small area needed, low EMC, and basis for modules in both series and in parallel arrangement.

Several of these possible advantages are further described below in connection with different embodiments.

Specific Embodiments of the Invention

Below some specific embodiments of the present invention are disclosed. Moreover, different alternatives, details and advantages of the present invention are also further discussed.

According to one specific embodiment, the primary side comprises one single winding. This may be beneficial as it enables to feed the system via one single power supply. According to the present invention the secondary side comprises multiple windings. The reasons for multiple windings on the secondary side are that the switching elements, such as IGBTs or MOSFETs, are beneficial to place on the secondary side since the fall and rise time becomes faster. The most cost-efficient and energy efficient way is to divide the high voltage on several switching elements, which is the reason why multiple windings is beneficial. It will be possible to use low cost standard components to build it. The components after each winding on the secondary side is independent. This simplifies the construction, since it's less problematic if the components have variations in values, such as variations in capacitance or switching times. Moreover, it may also be noted that if several switching elements are provided, they can be connected in parallel or serial connected.

According to the present invention, the secondary side comprises multiple pulse module units (PMUs), and wherein each PMU comprises a winding and a switching element. According to yet another specific embodiment of the present invention, the secondary side comprises multiple pulse module units (PMUs), wherein one or more PMUs comprise the winding, a rectifier bridge, a capacitor and a switching element. The capacitor stores the high voltage and this voltage is switched by one or more transistors to an application, e.g. a PEF chamber. The energy storage, such as capacitors, being placed on the secondary side implies that the high voltage pulses don't need to go through any inductor or transformer that can slow down the pulses. Therefore the edges of the pulses rise and fall fast, which is beneficial for some applications, such as a PEF treatment.

Moreover, it is beneficial to keep the area of this as small as possible. One reason for this is that this pulse circuit generates unwanted electromagnetic disturbances and the larger this loop is the more disturbances are generated. Another reason for keeping this circuit area small is to reduce the inductance, which causes a slow rise time of the voltage and current in the application, such as a PEF chamber. In an arrangement as described according to the present invention it's possible to build the generator so this circuit area becomes small, since it is possible to place the switching elements and capacitors close to each other. It may also be said that as the energy storage is based on capacitors and are placed on the secondary side, and is connected, the switching element can switch out the voltage to the application.

Moreover, and as mentioned above, on the secondary side there are multiple windings, which in turn feed diode bridges and capacitors. Therefore, according to the present invention there are multiple pulse module units (PMUs) according to above provided on the secondary side.

According to yet another embodiment, one or more PMUs also comprise a diode, preferably being parallel coupled over the switching element. In one arrangement configuration according to the present invention there is a diode next that is parallel coupled over the switching element and the capacitor. This serves three purposes. One purpose is to act as a freewheel diode after the pulse. The second purpose is to handle uneven switching times. If for example one switching element is slow to turn on, then the diode will open and let the pulse through. The third purpose is if one of the IGBTs are broken the diode will open and the generator can continue to function with a lower voltage.

Moreover, as should be understood from above, according to yet another specific embodiment of the present invention, the switching element is of transistor type, e.g. an IGBT or a FET/MOSFET.

According to yet another embodiment, ground is arranged connected to the switching element. Suitably, ground is arranged in the middle of several switching elements, such as shown in FIG. 1. This ground makes sure that voltage on the components on the secondary side will never go above half the total voltage. This also simplifies the isolation to components on the secondary side.

Furthermore, according to yet another embodiment, the switching element comprises driver circuit containing short-circuit protection. The advantage with this is that if there is a short-cut in the application, such as in a PEF chamber, the electrical short-circuit protection will close the switching element quickly.

The voltage possible to use according to the present invention may be at different levels. According to one embodiment of the present invention, the AC voltage peak-to-peak provided in each PMU is in the range of 1.6-8,000 V, preferably 600-4,000 V, more preferably 1,000-3,000 V. The level range depends on the intended number of PMUs on the secondary side.

Moreover, according to yet another embodiment, each PMU comprises one switching element and wherein ground is arranged in the middle of all switching elements. Again, this ground makes sure that voltage on the components on the secondary side will never go above half the total voltage, and this simplifies the isolation to components on the secondary side.

Furthermore, also the number of PMUs may vary according to the present invention. According to one specific embodiment of the present invention, the number of PMUs is in the range of 2-1,024, preferably in the range of 2-64, more preferably in the range of 4-16. For instance, a number of PMUs in the range of 4-16 and an AC voltage peak-to-peak provided in each PMU in the range of 1,000-3,000 V is one preferred alternative.

In relation to the above, the following may also be stated. The energy storage suitably is charged via a rectifier circuit on an AC voltage. Moreover, the energy storage, the switching element and the rectifier is suitably arranged as an individual module, and this module can be connected in series with other similar modules and aggregate all voltages to a larger voltage that creates a high voltage pulse. These modules don't need to be connected in series, instead they can switch out their voltage to individual applications such as multiple PEF Chambers or the same PEF chamber but at different times or at the same time. Moreover, these modules can also be connected in parallel or serial in any combination to be able to create different voltages. Furthermore, these modules may also be connected in a way, so all the modules are connected in series and one side of the application, such as a PEF chamber, is connected to the center point or any point between the negative and positive end. The other side is connected to both the positive end and the negative end, which makes it possible to switch out pulses with alternating voltages, which is also called bipolar pulses. These modules may also be connected in a way so all the modules are connected in any combination of series and parallel coupling and one side of the application, such as a PEF chamber, is connected to the center point or any point between the negative and positive end. In such a case the other side is connected to both the positive end and the negative end, which makes it possible to switch out pulses with alternating voltages, which is also called bipolar pulses.

According to yet another embodiment of the present invention, the primary side comprises an H-bridge unit, preferably a phase shifted full bridge (PSFB) unit, which is arranged before the one single primary winding of the primary side. The H-bridge before the transformer of the high voltage pulse generator unit can be made in such a way so it's possible to achieve almost zero loss switching in both the H-bridge and the rectifier bridge. The turn-on losses can be reduced to a minimum by having an inductor directly after the H-bridge. This inductor needs to be adapted in such a way, so it matches with the length of the charging pulses from the H-bridge. To remove the switch-off losses the length of the charge pulses and capacitors can be matched so there are no switch losses, which in this case requires a quite slow charging frequency so the charge pulse is long enough to fully charge the capacitor and this requires a large enough transformer so it doesn't get saturated.

According to yet a further embodiment, the voltage provided on the primary side is in the range of 600-1,500 V. Moreover, according to one embodiment, a power factor correction (PFC) unit is arranged connected to the H-bridge unit. In this configuration the DC voltage is produced by the PFC, which has the advantage that it's smoothening the uneven power output from the circuit so the system complies with laws and regulations.

As hinted above, according to yet another specific embodiment, the secondary side is connected to a high voltage unit, preferably a PEF (pulsed electric field) chamber. Moreover, according to yet another embodiment, the high voltage pulse generator unit is arranged to provide bipolar pulses. It should be noted that both monopolar and bipolar pulses are totally possible, however bipolar pulses may be beneficial. First of all, this reduces or eliminates issues related to electrically charged particles building up on the electrodes, which otherwise is a risk when using monopolar pulse processing. Secondly, the electrode lifetime is increased, which in turn is obtained by the switched use of the two electrodes.

Below, yet further specifics of embodiments of the present invention are provided. Moreover, further details are provided with reference to implementation of the present invention.

A generator according to the present invention may produce high voltage pulses with a power of from 1 to 200 kW, such as from 2 to 100 kW, e.g. from 4 to 40 kW. Moreover, the pulses from the generator suitably have a pulse width of from 0.5 to 500, such as from 1 to 200, e.g. from 1 to 50 micro seconds. Furthermore, the current in each pulse may be in the range of 1-20 000, such as 20-5,000, e.g. 50-2,000 A. Furthermore, the frequency of the pulses suitably is in the range of 10-50,000, such as 50-10,000, e.g. 100-5,000 Hz. The rise time and fall time of the voltage in the pulses suitably is in the range of 0.05-10, such as 0.1-2 microseconds.

In relation to another aspect, the output amplitude AC voltage per PMU according to the present invention suitably is peak-to-peak 300-8,000 V, such as 600-4,000 V, e.g. from 1000 to 2000 V. Furthermore, the AC voltage suitably has a frequency of 50-300,000 Hz, such as 500-20,000 Hz, e.g. 1,000-10,000 Hz. Moreover, the AC voltage may be a square wave voltage, a shape more like a sinus voltage, or a square wave which has a slow rise time due to an inductor and is falling in the end of the charge pulse, since the charge pulse is long enough to fully charge the energy storage. Also, the AC voltage can be produced by a DC voltage and an H-bridge, as mentioned above. In this regard it may also be said that the H-bridge can in one configuration incorporate an inductor that slows down the rise time of the square wave. This may be of interest to reduce switch-on losses in the H-bridge and rectifier diodes. Moreover, the H-bridges switching frequency can be matched with the capacitors so capacitors are fully charged just before each pulse. This may be of interest to reduce switch-off losses.

To summarize in a general way, the present invention provides an arrangement with a transformer capable of generating high voltage pulses in a simple, compact, cost efficient and power efficient way. This design is possible to implement with mainly standard components. Moreover, this high-power generator is designed in a unique way so it is energy efficient and cost-efficient, and also with few components, small size, and low EMI. The generator produces short pulses at high power, high voltage and high currents. In one of its configurations there is a PFC that is smoothening the uneven current peaks. From the PFC there is a DC voltage that goes into an H-bridge that feeds a transformer. On the secondary side of the transformer there is suitably multiple windings that feed diode bridges and capacitors. The capacitors store the high voltage and this voltage is switched by transistors to an application such as a PEF chamber.

DESCRIPTION OF THE DRAWINGS

In FIG. 1 there is shown one specific embodiment according to the present invention.

As may be seen, the high voltage pulse generator unit comprises a primary side, a transformer and a secondary side. According to this embodiment, the primary side comprises one single winding and the secondary side comprises multiple pulse module units (PMU). Each PMU comprises one winding, a rectifier bridge, a capacitor and a switching element. Moreover, according to this embodiment, each PMU also comprises a diode, in this case being parallel coupled over the switching element. Furthermore, the switching element is of transistor type, namely an IGBT.

Moreover, ground is arranged connected to the switching element, and as may be seen, in this case ground is arranged in the middle of all switching elements.

Furthermore, the secondary side of the high voltage pulse generator unit is connected to a high voltage unit, in this case a PEF (pulsed electric field) chamber.

The invention claimed is:

1. High voltage pulse generator unit comprising a primary side, a transformer and a secondary side, wherein the primary side comprises a winding and wherein the secondary side comprises multiple windings and multiple pulse module units (PMUs), wherein each PMU comprises the winding and a switching element, and wherein the primary side comprises an H-bridge unit which is arranged before the one single primary winding of the primary side.

2. High voltage pulse generator unit according to claim 1, wherein the primary side comprises one single winding.

3. High voltage pulse generator unit according to claim 1, wherein the secondary side comprises multiple pulse module units (PMUs), wherein one or more PMUs comprise the winding, a rectifier bridge, a capacitor and a switching element.

4. High voltage pulse generator unit according to claim 1, wherein one or more PMUs also comprise a diode, preferably being parallel coupled over the switching element.

5. High voltage pulse generator unit according to claim 1, wherein the switching element is of transistor type, e.g. an IGBT or a FET.

6. High voltage pulse generator unit according to claim 1, wherein ground is arranged connected to the switching element.

7. High voltage pulse generator unit according to claim 1, wherein the switching element comprises driver circuit containing short-circuit protection.

8. High voltage pulse generator unit according to claim 1, wherein the AC voltage peak-to-peak provided in each PMU is in the range of 1.6-8,000 V, preferably 600-4,000 V, more preferably 1000-3,000 V.

9. High voltage pulse generator unit according to claim 1, wherein each PMU comprises one switching element and wherein ground is arranged in the middle of all switching elements.

10. High voltage pulse generator unit according to claim 1, wherein the number of PMUs is in the range of 2-1,024, preferably in the range of 2-64, more preferably in the range of 4-16.

11. High voltage pulse generator unit according to claim 1, wherein the voltage provided on the primary side is in the range of 600-1,500 V.

12. High voltage pulse generator unit according to claim 1, wherein a power factor correction (PFC) unit is arranged connected to the H-bridge unit.

13. High voltage pulse generator unit according to claim 1, wherein the secondary side is connected to a high voltage unit, preferably a PEF (pulsed electric field) chamber.

14. High voltage pulse generator unit according to claim 1, wherein the high voltage pulse generator unit is arranged to provide bipolar pulses.

* * * * *